United States Patent
Farquhar et al.

(10) Patent No.: US 6,329,713 B1
(45) Date of Patent: Dec. 11, 2001

(54) INTEGRATED CIRCUIT CHIP CARRIER ASSEMBLY COMPRISING A STIFFENER ATTACHED TO A DIELECTRIC SUBSTRATE

(75) Inventors: Donald Seton Farquhar, Endicott; Lisa Jeanine Jimarez, Newark Valley; Michael Joseph Klodowski, Endicott, all of NY (US); Jeffrey Alan Zimmerman, Manassas, VA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/176,654

(22) Filed: Oct. 21, 1998

(51) Int. Cl.[7] .............. H01L 23/08; H01L 23/12; B32B 31/12; B32B 31/18
(52) U.S. Cl. .......... 257/712; 257/713; 257/738; 257/737; 257/700; 257/758; 257/782; 257/723; 257/730; 257/778; 257/777; 257/783; 257/703; 257/678
(58) Field of Search .................. 267/678, 723, 267/730, 778, 777, 783, 713–714, 700, 758, 703, 646, 782

(56) References Cited

U.S. PATENT DOCUMENTS

| | | | |
|---|---|---|---|
| 5,208,188 | 5/1993 | Newman | 437/220 |
| 5,237,204 * | 8/1993 | Val | 257/698 |
| 5,239,448 * | 8/1993 | Perkins et al. | 257/686 |
| 5,355,283 | 10/1994 | Marrs et al. | 361/760 |
| 5,406,124 * | 4/1995 | Morita et al. | 257/783 |
| 5,438,478 * | 8/1995 | Kondo et al. | 361/709 |
| 5,444,296 * | 8/1995 | Kaul et al. | 257/723 |
| 5,471,027 * | 11/1995 | Call et al. | 219/85.13 |
| 5,563,773 * | 10/1996 | Katsumata | 257/723 |
| 5,567,983 * | 10/1996 | Hirano et al. | 257/723 |
| 5,608,261 * | 3/1997 | Bhattacharyya et al. | 257/700 |
| 5,608,262 * | 3/1997 | Degani et al. | 257/723 |
| 5,615,089 * | 3/1997 | Yoneda et al. | 361/764 |
| 5,622,588 * | 4/1997 | Weber | 156/263 |
| 5,688,408 * | 11/1997 | Tsuru et al. | 216/17 |
| 5,723,907 * | 3/1998 | Akram | 257/723 |
| 5,728,248 * | 3/1998 | Weber | 156/257 |
| 5,729,896 * | 3/1998 | Dalal et al. | 29/840 |
| 5,766,740 * | 6/1998 | Olson | 428/289 |
| 5,776,512 * | 7/1998 | Weber | 425/116 |

(List continued on next page.)

FOREIGN PATENT DOCUMENTS

| | | |
|---|---|---|
| 8-73614 | 3/1996 | (JP) . |
| 10-022325 A | 1/1998 | (JP) . |
| 10-189638 | 7/1998 | (JP) . |
| 10-256413 A | 9/1998 | (JP) . |

OTHER PUBLICATIONS

"High Performance Carrier Technology: Materials And Fabrication", by Light et al, 1993 International Electronics Packaging Conference, San Diego, California, vol. One.

"High Performance Carrier Technology", by Heck et al, 1993 International Electronics Packaging Conference, San Diego, California, vol. One.

"Process Considerations in the Fabrication of Teflon Printed Circuit Boards", by Light et al, 1994 Proceedings, 44 Electronic Components & Technology Conference, 5/94.

Primary Examiner—Alexander O. Williams
(74) Attorney, Agent, or Firm—Connolly Bove Lodge & Hutz; Lawrence R. Fraley

(57) ABSTRACT

An integrated circuit chip carrier assembly is provided by joining a substrate having electrically conductive regions on at least one major surface thereof to a stiffener by a bonding film. The bonding film comprises a dielectric substrate having a thermoset adhesive on both of its major surfaces. The thermoset adhesive prior to the bonding is a B-stage adhesive, is tack-free at normal room temperatures and is solvent free.

33 Claims, 2 Drawing Sheets

U.S. PATENT DOCUMENTS

| | | | |
|---|---|---|---|
| 5,792,677 | * | 8/1998 | Reddy et al. .......................... 438/122 |
| 5,796,164 | * | 8/1998 | McGraw et al. ....................... 257/723 |
| 5,798,014 | * | 8/1998 | Weber .................................. 156/263 |
| 5,798,567 | * | 8/1998 | Kelly et al. ........................... 257/723 |
| 5,798,909 | * | 8/1998 | Bhatt et al. ........................... 257/738 |
| 5,811,879 | * | 9/1998 | Akram .................................. 257/723 |
| 5,821,628 | * | 10/1998 | Hotta ................................... 257/783 |
| 5,835,355 | * | 11/1998 | Dordi ................................... 361/692 |
| 5,838,061 | * | 11/1998 | Kim ..................................... 257/686 |
| 5,838,545 | * | 11/1998 | Clocher et al. ....................... 361/719 |
| 5,841,194 | * | 11/1998 | Tsukamoto ........................... 257/729 |
| 5,843,808 | * | 12/1998 | Karnezos .............................. 438/121 |
| 5,859,473 | * | 1/1999 | Ikata et al. ............................ 257/723 |
| 5,864,173 | * | 1/1999 | Fogelson ............................... 257/666 |
| 5,869,894 | * | 2/1999 | Degani et al. ........................ 257/723 |
| 5,869,896 | * | 2/1999 | Baker et al. .......................... 257/724 |
| 5,870,823 | * | 2/1999 | Bezama et al. ...................... 257/703 |
| 5,883,426 | * | 3/1999 | Tokuno et al. ........................ 257/686 |
| 5,895,967 | * | 4/1999 | Stearns et al. ........................ 257/691 |
| 5,973,389 | * | 10/1999 | Culnane et al. ...................... 257/678 |

* cited by examiner

INTEGRATED CIRCUIT CHIP CARRIER ASSEMBLY COMPRISING A STIFFENER ATTACHED TO A DIELECTRIC SUBSTRATE

TECHNICAL FIELD

The present invention is concerned with an integrated circuit chip carrier assembly. More particularly, the present invention is concerned with adhering a laminate chip carrier to a stiffener. Moreover, the present invention is concerned with a method for fabricating the integrated circuit chip carrier assembly.

BACKGROUND OF THE INVENTION

Packaging techniques for integrated circuits have developed with an emphasis on miniaturization. Improved methods enable integrating millions of transistor circuit elements into single integrated semiconductor embodied circuits or chips, and has resulted in increased emphasis on methods to package these circuits in space efficient, yet reliable and mass producible packages. Forming an electronic system requires combining a plurality of integrated circuits and electrically connecting integrated circuits together. Once connected, other devices such as keyboards, video monitors and printers may be connected to and utilized with the electronic system.

In order to establish this interconnection, conductive paths must be made available to connect the internal circuitry of the integrated circuit chip to external system electrical circuits. For example, the integrated circuit package contains conductors referred to as "bond fingers" that are interconnected to bond pads of an integrated circuit wafer by, for example, wire bonding or other known techniques. The bond fingers in turn are connected to integrated circuit package pins that are used to connect to printed circuit boards or cards. Ball grid arrays are used for achieving a high density of external chip connections to be made as compared to other package integrated circuits having leads extending from the package.

In certain structures, a stiffener is joined to a printed circuit board or laminate circuit element having a cavity in it for receiving an integrated circuit chip. This type of structure can be referred to as a cavity down chip carrier package. The stiffener can be continuous or can have holes or cutouts therein.

In a typical arrangement a metal stiffener such as copper with plated gold on its back side and copper on its other side is joined to the printed circuit board. Typically, an adhesive such as an epoxy adhesive is coated onto the side of the stiffener containing the copper and then partially cured to its B-stage. A chemical process is typically used such as sodium hypochlorite to oxidize the copper prior to adhesive application to promote adhesion.

In addition, the backside of the printed circuit board that is to be joined to the stiffener contains ground planes as well as gold plated circuitry, with the ground planes and circuitry being protected by a solder mask such as Vacrel®. The solder mask is typically vapor blasted for roughening to enhance its adhesive characteristics and then a layer of epoxy is applied to it and then cured to its B-stage. The epoxy provides the adhesion for joining the stiffener to the printed circuit board.

However, this particular technique suffers from two serious problems. In particular, the epoxy, after lamination, has voided areas which tends to induce delamination. Furthermore, the Vacrel® reacts with the copper during thermal cycling thereby causing copper oxide to degrade which also results in problems of delamination. A bare cavity requires that no epoxy be in the cavity. The screening process leaves epoxy in the cavity or the epoxy can bleed into the cavity during cure. In addition, the process is not relatively easy to control and depends upon the relative skill of the process operator for achieving success. Also, such technique requires additional interfacing materials.

SUMMARY OF INVENTION

The present invention overcomes various problems of the prior art including eliminating the need for the chemical treatment such as the sodium hypochlorite on the stiffener and power planes on the printed circuit board. Furthermore, the present invention eliminates the need for a solder mask on the ground planes and circuitry of the printed circuit board that is to be joined to the stiffener.

More particularly, the present invention is concerned with an integrated circuit chip carrier structure that comprises a substrate having electrically conductive regions on at least one major surface thereof. A stiffener is attached to the substrate by a bonding film. The bonding film comprises a dielectric substrate having a thermoset adhesive on both of its major surfaces.

In addition, the present invention is concerned with a method for fabricating an integrated circuit chip carrier assembly which comprises providing a substrate having electrically conductive regions on at least one major surface thereof. A stiffener is attached to the substrate by providing a bonding film located between the substrate and the stiffener. The bonding film comprises a dielectric substrate having a B-stage thermoset adhesive on both of its major surfaces. The adhesive is tack free at normal room temperatures. The structure of the substrate, bonding film and stiffener is laminated and heated to elevated temperatures for achieving the bond between the substrate and stiffener.

Furthermore, the present invention relates to the product obtained by the above disclosed process.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

In order to facilitate an understanding of the present invention, reference will be made to the figures wherein the same numeral in different figures represents the same element.

Figure 1:
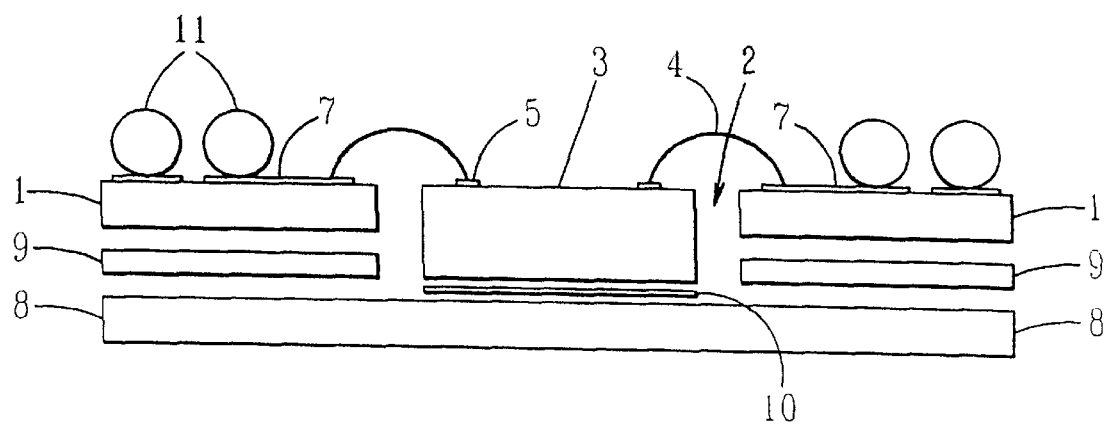
FIG. 1 is an exploded schematic diagram of one embodiment of a typical structure in accordance with the present invention along with an integrated circuit chip.

More particularly, FIG. 1 illustrates a cavity down chip carrier package including an integrated circuit chip. Numeral 1 illustrates a laminate circuit element such as a printed circuit board which typically comprises conductive circuitry (not shown) such as copper on both major surfaces of the substrate. The substrate is a dielectric and typically a fiber reinforced polymer composition such as a fiber reinforced epoxy composition, more typically a FR-4 composition including those disclosed in U.S. Pat. Nos. 3,523,037; 4,597,996, disclosures of which are incorporated herein by reference. Other polymers include polyimides such as Upilex SGA available from UBE Ltd., and polytetrafluoroethylene and composites containing polytetrafludroethylene such as Rogers 2800 available from Rogers Corporation.

The conductive layer is preferably copper and in many cases copper being overplated with gold.

A cavity 2 is provided in the laminate circuit element for receiving an integrated circuit chip 3. The integrated circuit chip 3 is attached to the laminate circuit element 1 such as by wire bonds 4 that connect between bond pads 5 on the integrated circuit chip 3 to electrically conductive region 7 on the substrate 1. These electrically conductive regions 7 can also preferably be formed on the other major surface of the substrate 1. If necessary, electrically conductive vias can be provided through the substrate 1 to connect the electrically conductive regions on the top surface to those on the bottom surface.

The laminate circuit element 1 is joined to a stiffener 8 by a bonding film 9. The bonding film comprises a dielectric substrate having a B-stage adhesive on both major surfaces of the dielectric substrate. The dielectric substrate is preferably a polyimide or polyepoxide, but can be other dielectric polymeric materials such as polytetrafluoroethylene. The substrate is typically about 0.5 to about 3 mils thick and more typically about 2 to about 3 mils thick.

The B-stage adhesive on both major surfaces of the substrate is a thermoset adhesive, is solvent-free and tack-free at normal room temperatures. This makes it possible to readily handle the bonding film and position it and the various layers to be bonded during the registration and lay up operations prior to the bonding. Preferably, the adhesives on each side of the dielectric substrate are capable of being cured at substantially the same temperature range and preferably is the same material on both sides of the dielectric substrate. By being curable in the same temperature range, the subsequent lamination of the composite can be carried out in one operation rather than using a sequence of at least two temperature ranges. This further simplifies the process. The preferred adhesive is a B-stage acrylic or methacrylic adhesive. However, other B-stage adhesives having the above disclosed characteristics such as epoxies, cyanate esters and BT resins may be used, if desired. The adhesive layer is typically present at a thickness of about 0.5 to about 5 mils and more typically at about 0.5 to about 2 mils on each side of the dielectric substrate.

A suitable bonding film that can be employed according to the present invention is Pyralux® LF bond ply available from DuPont. A disclosure of such can be found in technical information sheet from DuPont entitled "Flexible Circuit Materials Pyralux® LF Bond Ply Flexible Composites", disclosure of which is incorporated herein by reference. Another commercially available bonding film is R-Flex® available from Rogers Corporation.

The stiffener 8 is typically a metal such as copper, gold plated copper, copper oxide, and nickel plated copper and can act as a heat sink or heat spreader. Other suitable stiffeners include stainless steel and Invar®. The integrated chip 3 is attached to a surface of the stiffener 8 with a adhesive composition 10 such as an epoxy adhesive as well known in the art. The laminate circuit element 1, bonding film 9 and stiffener 8 stack are bonded together by laminating which is typically carried out at pressures of about 50 to about 500 psi and more typically at about 200 to about 350 psi and at temperatures of typically about 122 to about 216° C. and more typically at about 138 to about 193° C.

Prior to the laminating, the bonding film can be routed or punched to the same dimensions as the cavities on the printed circuit board. Upon subsequent lamination, the adhesive does not bleed into the cavity area of the stiffener, due to the relatively high viscosity of the adhesive after B-staging. The bond ply can be positioned with respect to the stiffener and printed circuit board using alignment holes and pins and then laminated using conventional lamination procedures. Careful registration of the bonding film to the printed circuit board cavity edge is necessary for the subsequent wire bonding. Accordingly, the ability of the bonding film to be handled and positioned in a relatively easy manner during this operation is a significant advantage to carrying out the process. Moreover if desired, rather than include a cavity in the bonding film, separate bonding films can be used for placing on opposite sides of the chip.

After the lamination, the integrated circuit chip 3 can be placed in the cavity 2 and bonded to the stiffener 8 by an adhesive 10 such as a die attach adhesive such as Ablebond 965, a conventional epoxy adhesive used for such purposes.

In addition, the wire bonds 4 can be connected from pads 5 on the integrated circuit chip 3 to conductive regions 7 of the laminate circuit element. Solder balls 11 can be formed on pads on the integrated circuit element. Furthermore, if desired an overmold or globtop material (not shown) can be provided above the chip to protect the wire bonds.

Figure 2:
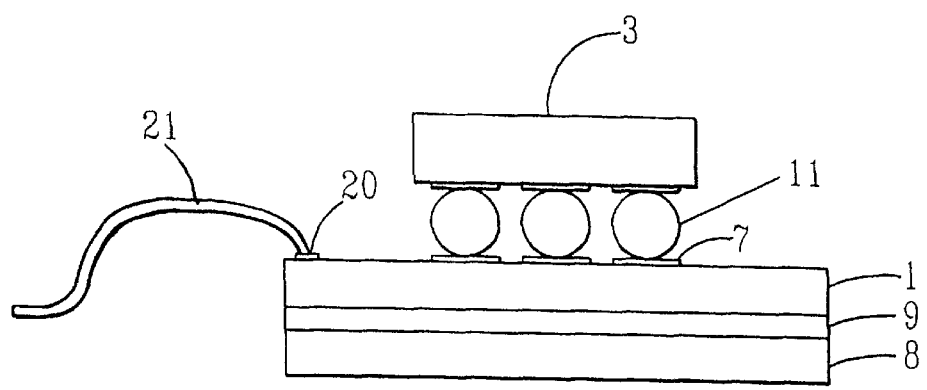
FIG. 2 is a schematic diagram of an alternative embodiment of another typical structure in accordance with the present invention along with an integrated circuit chip.

FIG. 2 illustrates another embodiment of a chip carrier package including an integrated circuit chip which does not include a cavity for receiving the integrated circuit chip. In particular, numeral 1 illustrates a laminate circuit element such as a printed circuit board which typically comprises conductive circuitry (not shown) such as copper on both major surfaces of the substrate. The substrate is a dielectric and typically a fiber reinforced polymer composition such as a fiber reinforced epoxy composition, more typically a FR-4 composition including those disclosed in U.S. Pat. Nos. 3,523,037; 4,597,996, disclosures of which are incorporated herein by reference. Other polymers include polyimides such as Upilex SGA available from UBE Ltd., and polytetrafluoroethylene and composites containing polytetrafluoroethylene such as Rogers 2800 available from Rogers Corporation.

The conductive layer is preferably copper and in many cases copper being overplated with gold.

An integrated circuit chip 3 is attached to the laminate circuit element 1 by C4 attachment solder balls 11 that connect between bonding sites (not shown) on the integrated circuit chip 3 to electrically conductive solder pads located on electrically conductive regions 7 on the substrate 1. These electrically conductive regions 7 can also preferably be formed on the other major surface of the substrate 1. If necessary, electrically conductive vias can be provided through the substrate 1 to connect the electrically conductive regions on the top surface to those on the bottom surface. The integrated chip 3 can also be wire bonded to the substrate 1 in the manner described above for FIG. 1.

The laminate circuit element 1 is joined to a stiffener 8 by a bonding film 9. The bonding film comprises a dielectric substrate having a B-stage adhesive on both major surfaces of the dielectric substrate. The dielectric substrate is preferably a polyimide or polyepoxide, but can be other dielectric polymeric materials such as polytetrafluoroethylene. The substrate is typically about 0.5 to about 3 mils thick and more typically about 2 to about 3 mils thick.

The B-stage adhesive on both major surfaces of the substrate is a thermoset adhesive, is solvent-free and tack-free at normal room temperatures. Preferably, the adhesives on each side of the dielectric substrate are capable of being cured at substantially the same temperature range and most preferably is the same material on both sides of the dielectric substrate. The preferred adhesive is a B-stage acrylic or methacrylic adhesive. However, other B-stage adhesives having the above disclosed characteristics as discussed above with respect to FIG. 1 may be used, if desired. The adhesive layer is typically present at a thickness of about 0.5 to about 5 mils and more typically at about 0.5 to about 2 mils on each side of the dielectric substrate.

Suitable bonding films that can be employed are Pyralux® LF bond ply available from DuPont and R-Flex® from Rogers Corporation.

The stiffener 8 is typically a metal such as copper or any of the materials disclosed above and can act as a heat sink or heat spreader. The laminate circuit element 1, bonding film 9 and stiffener 8 stack are bonded together by laminating which is typically carried out at pressures of about 50 to about 500 psi and more typically at about 200 to about 350 psi and at temperatures of typically about 122 to about 216° C. and more typically at about 138 to about 193° C.

After the lamination, the integrated circuit chip 3 can be bonded to the laminate circuit element for instance by C4 solder bonds or wire bonding. Furthermore, if desired an encapsulant (not shown) can be used to protect the C4 solder balls or in the case of wire bonds, an overmold or globtop material (not shown) can be provided above the chip to protect the wire bonds. The assembly can be attached to a circuit card (not shown) by a gull wing or J-lead 21 bonded to circuit pad 20.

Figure 3:
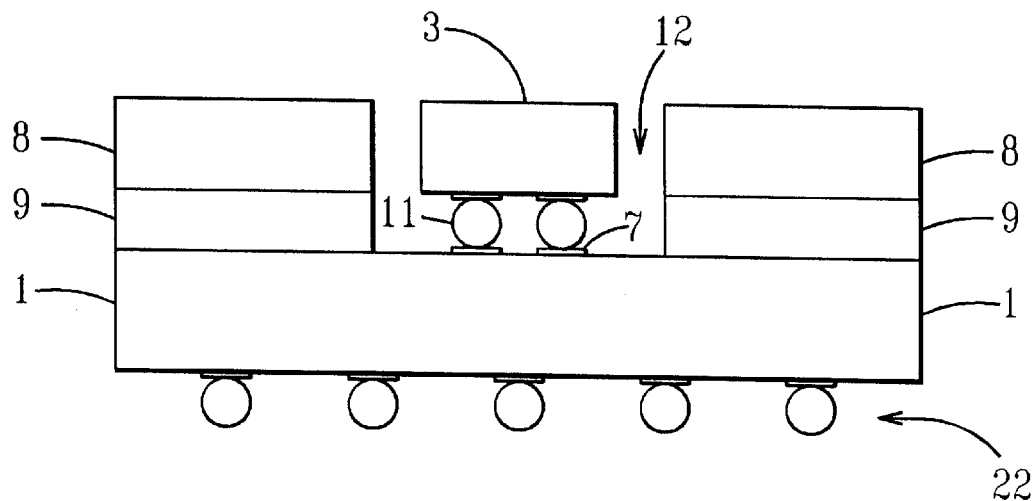
FIG. 3 is a schematic diagram of another alternative embodiment of a typical structure according to the present invention along with an integrated circuit chip.

FIG. 3 illustrates a further embodiment of a chip carrier package including an integrated circuit chip that includes a cavity in the stiffener for receiving the integrated circuit chip. Numeral 1 illustrates a laminate circuit element such as a printed circuit board which typically comprises conductive circuitry (not shown) such as copper on both major surfaces of the substrate. The substrate is a dielectric and typically of the type disclosed above in discussing FIG. 1.

The conductive layer is preferably copper and in many cases copper being overplated with gold.

A cavity 12 is provided in the laminate circuit stiffener 8 for receiving an integrated circuit chip 3. The integrated circuit chip 3 is attached to the laminate circuit element 1 for instance by C4 solder balls 11 as described for the embodiment of FIG. 2 that connect between bonding sites (not shown) on the integrated circuit chip 3 to electrically conductive solder pads located on electrically conductive regions 7 on substrate 1. These electrically conductive regions 7 can also preferably be formed on the other major surface of the substrate 1. If necessary, electrically conductive vias can be provided through the substrate 1 to connect the electrically conductive regions on the top surface to those on the bottom surface. The integrated circuit chip 3 can also be wire bonded to substrate 1 in the manner described above for FIG. 1.

The laminate circuit element 1 is joined to a stiffener 8 by a bonding film 9. The bonding film comprises a dielectric substrate having a B-stage adhesive on both major surfaces of the dielectric substrate. The dielectric substrate is preferably a polyimide or polyepoxide, but can be other dielectric polymeric materials such as polytetrafluoroethylene. The substrate is typically about 0.5 to about 3 mils thick and more typically about 2 to about 3 mils thick.

The B-stage adhesive on both major surfaces of the substrate is a thermoset adhesive, is solvent-free and tack-free at normal room temperatures. Preferably, the adhesives on each side of the dielectric substrate are capable of being cured at substantially the same temperature range and preferably is the same material on both sides of the dielectric substrate. The preferred adhesive is a B-stage acrylic or methacrylic adhesive. However, other B-stage adhesives having the above disclosed characteristics as discussed above may be used, if desired. The adhesive layer is typically present at a thickness of about 0.5 to about 5 mils and more typically at about 0.5 to about 2 mils on each side of the dielectric substrate.

Suitable bonding films that can be employed according to the present invention is Pyralux® LF bond ply available from DuPont and R-Flex® from Rogers Corporation.

The stiffener 8 is typically a metal such as copper or any of the materials disclosed above and can act as a heat sink or heat spreader. The laminate circuit element 1, bonding film 9 and stiffener 8 stack are bonded together by laminating which is typically carried out at pressures of about 50 to about 500 psi and more typically at about 200 to about 350 psi and at temperatures of typically about 122 to about 216° C. and more typically at about 138 to about 193° C.

Prior to the laminating, the bonding film can be routed or punched to the same dimensions as the cavities on the stiffener. The bond ply can be positioned with respect to the stiffener and printed circuit board using alignment holes and pins and then laminated using conventional lamination procedures.

After the lamination, the integrated circuit chip 3 can be bonded to the laminate circuit element, for instance, by C4 solder bonds or wire bonding. Furthermore, if desired an encapsulant (not shown) can be used to protect the C4 solder or in the case of wire bonds an overmold or globtop material (not shown) can be provided above the chip to protect the wire bonds. The assembly can be attached to a circuit card (not shown) by ball grid array 22.

Figure 4:
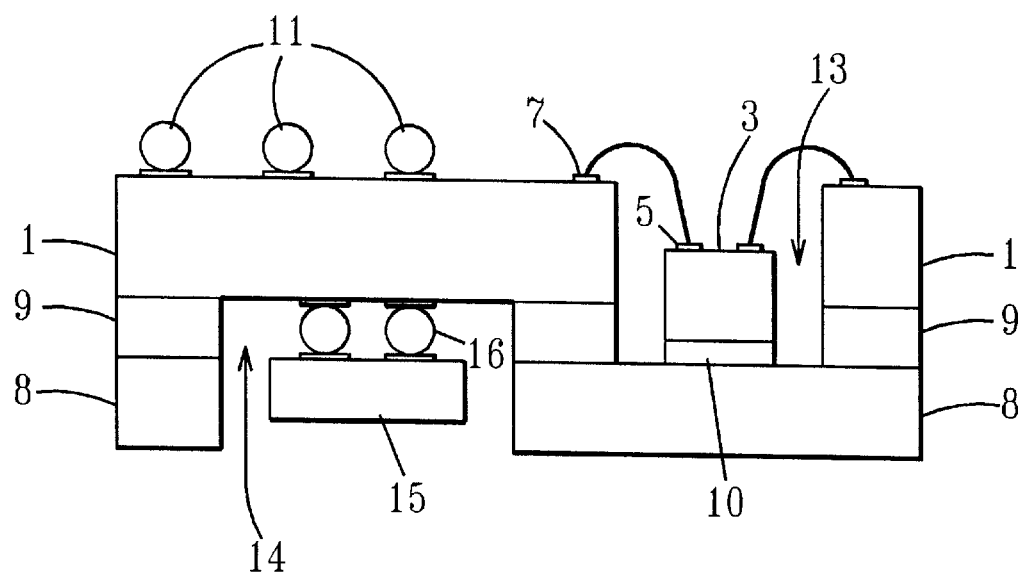
FIG. 4 is a schematic diagram of a still further alternative embodiment of a typical structure according to the present invention along with an integrated circuit chip and capacitor or second integrated circuit chip.

FIG. 4 illustrates a still further chip carrier package including an integrated circuit chip wherein both the laminate circuit element and stiffener have a cavity for receiving an active component. Numeral 1 illustrates a laminate circuit element such as a printed circuit board which typically comprises conductive circuitry (not shown) such as copper on both major surfaces of the substrate. The substrate is a dielectric and typically of the type disclosed above in discussing FIG. 1.

The conductive layer is preferably copper and in many cases copper being overplated with gold.

A cavity 13 is provided in the laminate circuit stiffener 8 for receiving an integrated circuit chip 3. The integrated circuit chip 3 is attached to the laminate circuit element 1 such as by wire bonds 4 that connect between bond pads 5 on the integrated circuit chip 3 to electrically conductive regions 7 on the substrate 1. These electrically conductive regions 7 can also preferably be formed on the other major surface of the substrate 1. If necessary, electrically conductive vias can be provided through the substrate 1 to connect the electrically conductive regions on the top surface to those on the bottom surface.

A cavity 14 is provided in the stiffener 8 for receiving an integrated circuit chip or capacitor 15. The chip or capacitor 15 is attached to the laminate circuit element 1, for instance, by C4 solder balls 16 along the lines described above for the embodiment of FIG. 2 that connect between binding sites (not shown) on the chip or capacitor to electrically conductive solder pads (not shown) located on electrically conductive regions (not shown) on substrate 1. The chip or capacitor can also be wire bonded to the substrate 1 in the manner described above for FIG. 1.

The laminate circuit element 1 is joined to a stiffener 8 by a bonding film 9. The bonding film comprises a dielectric substrate having a B-stage adhesive on both major surfaces of the dielectric substrate. The dielectric substrate is preferably a polyimide or polyepoxide, but can be other dielectric polymeric materials such as polytetrafluoroethylene. The substrate is typically about 0.5 to about 3 mils thick and more typically about 2 to about 3 mils thick.

The B-stage adhesive on both major surfaces of the substrate is a thermoset adhesive, is solvent-free and tack-free at normal room temperatures. Preferably, the adhesives on each side of the dielectric substrate are capable of being cured at substantially the same temperature range and preferably is the same material on both sides of the dielectric substrate. The preferred adhesive is a B-stage acrylic or methacrylic adhesive. However, other B-stage adhesives having the above disclosed characteristics as discussed above may be used, if desired. The adhesive layer is typically present at a thickness of about 0.5 to about 5 mils and more typically at about 0.5 to about 2 mils on each side of the dielectric substrate.

Suitable bonding films that can be employed according to the present invention is Pyralux® LF bond ply available from DuPont and R-Flex® from Rogers Corporation.

The stiffener 8 is typically a metal such as copper or any of the materials disclosed above and can act as a heat sink or heat spreader. The integrated chip 3 is attached to a surface of the stiffener 8 with an adhesive composition 10 such as an epoxy adhesive as well known in the art. The laminate circuit element 1, bonding film 9 and stiffener 8 stack are bonded together by laminating which is typically carried out at pressures of about 50 to about 500 psi and more typically at about 200 to about 350 psi and at temperatures of typically about 122 to about 216° C. and more typically at about 138 to about 193° C.

Prior to the laminating, the bonding film can be routed or punched to the same dimensions as the cavities on the printed circuit board and stiffener. The bond ply can be positioned with respect to the stiffener and printed circuit board using alignment holes and pins and then laminated using conventional lamination procedures.

After the lamination, the integrated circuit chip 3 can be placed in the opening 13 and bonded to the stiffener 8 by adhesive 10 such as a die attach adhesive such as Ablebond 965, a conventional epoxy adhesive used for such purposes.

In addition, the wire bonds 4 can be connected from pads 5 on the integrated circuit chip to conductive regions 7 of the laminate circuit element. Solder balls 11 can be formed on pads on the integrated circuit element. Furthermore, if desired an overmold or globtop material (not shown) can be provided above the chip to protect the wire bonds.

Furthermore, after the lamination, the chip or capacitor 15 can be bonded to the laminate circuit element, for instance, by C4 solder bonds 16 or wire bonding. Moreover, if desired, an encapsulant (not shown) can be used to protect the C4 solder bonds or, in the case of wire bonds, an overmold or globtop material (not shown) can be provided above the chip to protect the wire bonds.

It should also be understood that in those embodiments employing a cavity in the laminate circuit, stiffener, and/or bonding film, instead of providing a cavity in a single member, plural individual members spaced apart and aligned on both sides of the chip or capacitor can be employed. However, such would involve increased complexity due to the need to position a greater number of elements.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. An integrated circuit chip carrier assembly comprising a first dielectric substrate having electrically conductive circuitry on at least one major surface thereof; a stiffener attached to the first dielectric substrate by a bonding film wherein the bonding film comprises a second dielectric substrate and wherein a thermoset adhesive is present on both major surfaces of the second dielectric substrate.

2. The integrated circuit chip carrier assembly of claim 1 wherein the stiffener is a metal stiffener.

3. The integrated circuit chip carrier assembly of claim 1 wherein the stiffener comprises copper.

4. The integrated circuit chip carrier of claim 1 wherein the second dielectric substrate of the bonding film is a polyimide having adhesive on both sides.

5. The integrated circuit chip carrier of claim 4 wherein the thermoset adhesive is a thermoset acrylic or methacrylic adhesive.

6. The integrated circuit chip carrier assembly of claim 1 wherein the adhesive is a thermoset acrylic or methacrylic adhesive.

7. The integrated circuit chip carrier assembly of claim 1 wherein the same adhesive is present on both major surfaces of the bonding film.

8. The integrated circuit chip carrier assembly of claim 1 which further comprises an integrated circuit chip.

9. The integrated circuit chip carrier assembly of claim 8 which further includes wire bonding of the integrated circuit chip to the substrate having electrically conductive circuitry.

10. The integrated circuit chip carrier assembly of claim 8 which further includes solder balls bonded to the substrate having electrically conductive circuitry thereon.

11. The integrated circuit chip carrier assembly of claim 1 wherein the first dielectric substrate having electrically conductive circuitry has at least one cavity therein for receiving an integrated circuit chip.

12. The integrated circuit chip carrier of claim 11 wherein the stiffener has at least one cavity therein for receiving an integrated circuit chip or capacitor.

13. The integrated circuit chip carrier assembly of claim 11 which further comprises an integrated circuit chip located within at least one cavity.

14. The integrated chip carrier assembly of claim 13 wherein the adhesive is an epoxy adhesive.

15. The integrated circuit chip carrier assembly of claim 13 which further includes wire bonding of the integrated circuit chip to the substrate having electrically conductive circuitry.

16. The integrated circuit chip carrier assembly of claim 13 which further includes solder balls bonded to the first dielectric substrate having electrically conductive circuitry thereon.

17. The integrated circuit chip carrier assembly of claim 12 which further comprises a first integrated circuit chip located with the at least one cavity in the first dielectric substrate having electrically conductive circuitry; and a second integrated circuit chip or capacitor located in the at least one cavity in the stiffener.

18. The integrated circuit chip carrier assembly of claim 17 wherein the first integrated circuit chip is attached to the stiffener by an adhesive and the second integrated circuit chip or carrier is attached to the first dielectric substrate by C4 solder connection.

19. The integrated chip carrier assembly of claim 18 wherein the adhesive is an epoxy adhesive.

20. The integrated circuit chip carrier assembly of claim 17 which further includes wire bonding of the integrated circuit chip to the first dielectric substrate having electrically conductive circuitry.

21. The integrated circuit chip carrier assembly of claim 17 which further includes solder balls bonded to the first dielectric substrate having electrically conductive circuitry thereon.

22. The integrated circuit chip carrier of claim 1 wherein the stiffener has at least one cavity therein for receiving an integrated circuit chip or capacitor.

23. The integrated circuit chip carrier assembly of claim 22 which further comprises an integrated circuit chip located within the at least one cavity of the stiffener.

24. The integrated circuit chip carrier assembly of claim 23 wherein the chip is attached to the first dielectric substrate by C4 solder balls.

25. The integrated circuit chip carrier of claim 1 wherein both the first dielectric substrate and stiffener do not include a cavity.

26. The integrated circuit chip carrier of claim 25 which further comprises an integrated circuit chip attached to the first dielectric substrate.

27. The integrated circuit chip carrier of claim 2 wherein the second dielectric substrate of the bonding film is a polyimide having adhesive on both sides.

28. The integrated chip carrier assembly of claim 1 wherein the stiffener is located as an outermost layer of the assembly.

29. The integrated chip carrier assembly of claim 1 wherein the second dielectric substrate is about 0.5 to about 3 mils thick and thermoset adhesive on both of the major surfaces of the second dielectric substrate is about 0.5 to about 5 mils thick.

30. The integrated chip carrier assembly of claim 1 wherein the second dielectric substrate is about 2 to about 3 mils thick and thermoset adhesive on both of the major surfaces of the second dielectric substrate is about 0.5 to about 2 mils thick.

31. The integrated circuit chip carrier assembly of claim 12 wherein the stiffener is a metal stiffener.

32. The integrated circuit chip carrier assembly of claim 18 wherein the stiffener is a metal stiffener.

33. The integrated circuit chip carrier assembly of claim 22 wherein the stiffener is a metal stiffener.

* * * * *